United States Patent [19]

Moriya et al.

[11] 4,376,268

[45] Mar. 8, 1983

[54] PHASE LOCKED LOOP HAVING AUTOMATIC-INPUT TUNING AND PHASE CONTROL CIRCUITS

[75] Inventors: Ryusuke Moriya, Hadano; Yasuhiro Fujimori, Tokyo, both of Japan

[73] Assignee: Sony Corporation, Tokyo, Japan

[21] Appl. No.: 200,009

[22] Filed: Oct. 23, 1980

[30] Foreign Application Priority Data

Oct. 31, 1979 [JP] Japan .................. 54-141671

[51] Int. Cl.³ .............................................. H03L 7/10
[52] U.S. Cl. ........................................ 331/10; 331/11;
331/25; 360/51; 375/120
[58] Field of Search .................................. 331/10–12,
331/14, 16, 17, 18, 25; 360/36, 37, 51; 455/260;
375/120; 329/122, 124; 328/155, 133

[56] References Cited

U.S. PATENT DOCUMENTS

| | | | |
|---|---|---|---|
| 3,609,408 | 9/1971 | Motisher et al. | 331/17 X |
| 3,908,115 | 9/1975 | Waggener | 375/120 X |

FOREIGN PATENT DOCUMENTS

| | | |
|---|---|---|
| 2394919 | 1/1979 | France . |
| 1015283 | 12/1965 | United Kingdom . |
| 1335142 | 10/1973 | United Kingdom . |
| 1382960 | 2/1975 | United Kingdom . |
| 1432432 | 4/1976 | United Kingdom . |
| 1556843 | 11/1979 | United Kingdom . |

Primary Examiner—Siegfried H. Grimm
Attorney, Agent, or Firm—Lewis H. Eslinger; Alvin Sinderbrand

[57] ABSTRACT

An automatic phase-controlled oscillator circuit for producing an output clocking signal whose phase and frequency vary with those of an input information signal applied thereto comprises an input circuit for receiving the input information signal; a variable-frequency tuning circuit for receiving a control signal and coupled to the input circuit for tuning on the basis of the frequency of the control signal to pass the information signal as a tuned signal; and a clocking signal generator, such as a phase-locked loop circuit, for providing the output clocking signal in dependence upon the phase of the tuned signal. The invention is favorably applied to a digital video tape recorder (DVTR) wherein the information signal is a digital signal reproduced from a tape as a result of relative motion between the tape and the DVTR, and the control signal is also reproduced from the tape to represent such relative motion. The oscillator circuit also preferably includes a phase comparator providing an error signal representing the phase difference as between the input information signal and the output clocking signal, and a phase adjuster, such as a variable delay line, responsive to the error signal.

17 Claims, 25 Drawing Figures

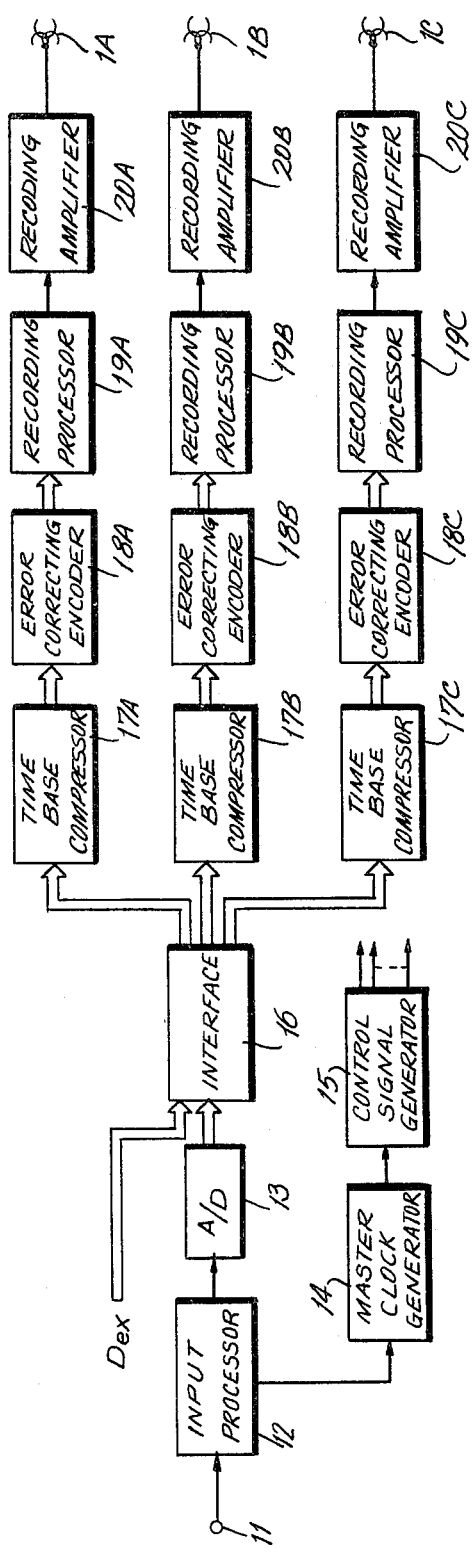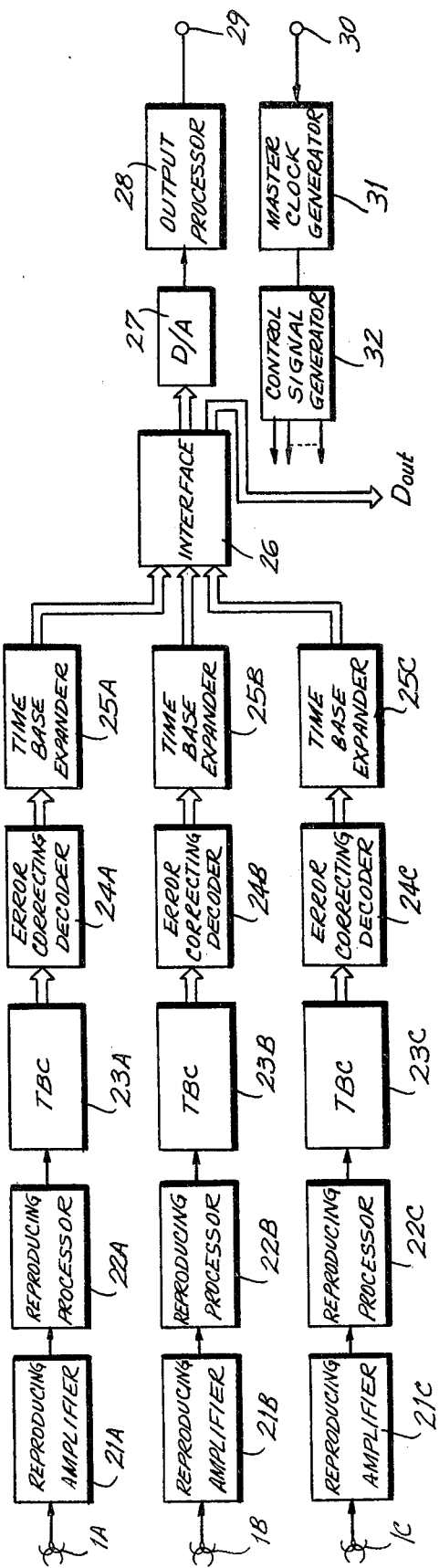
FIG.1
FIG.2

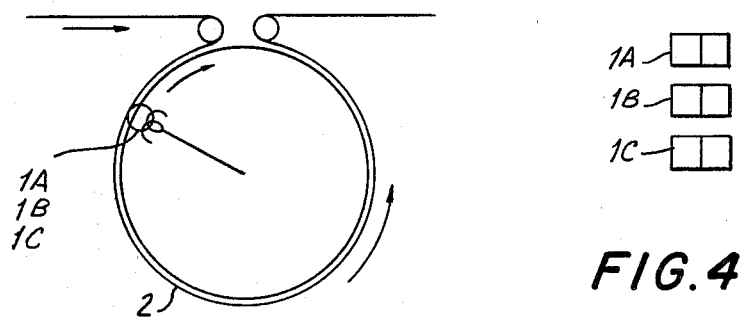
FIG. 3
FIG. 4
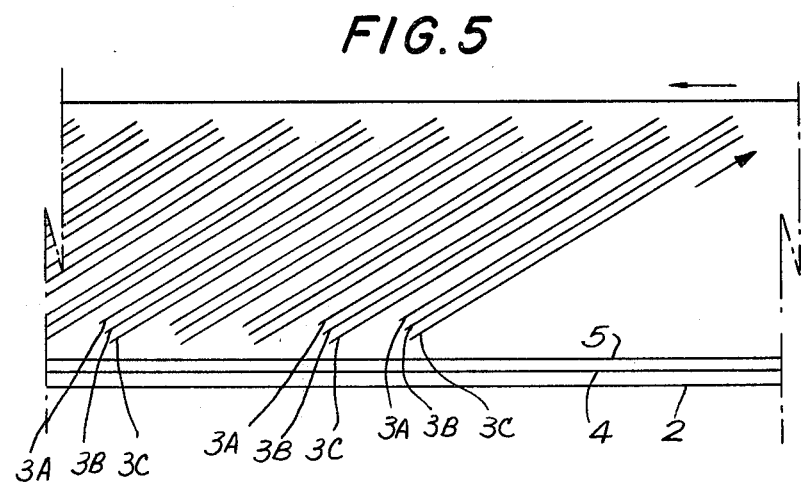
FIG. 5
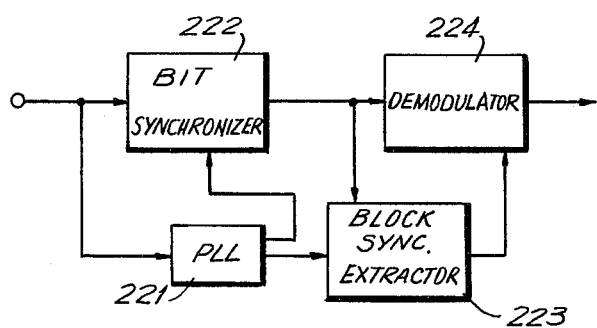
FIG. 8

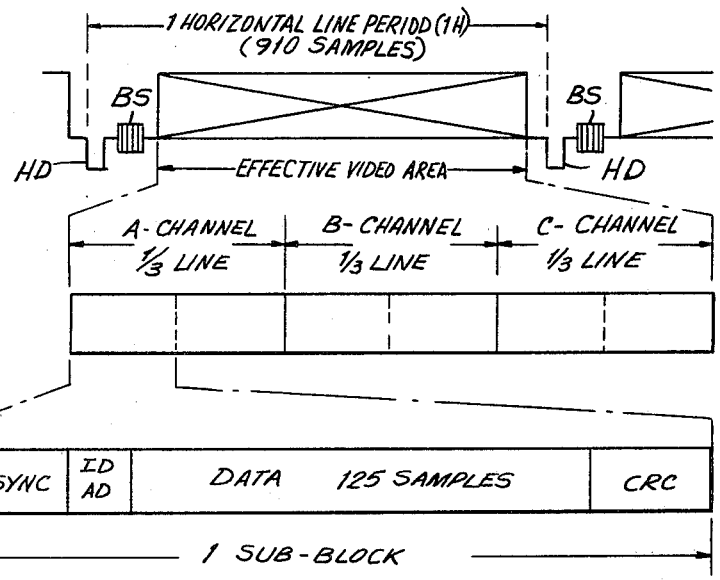
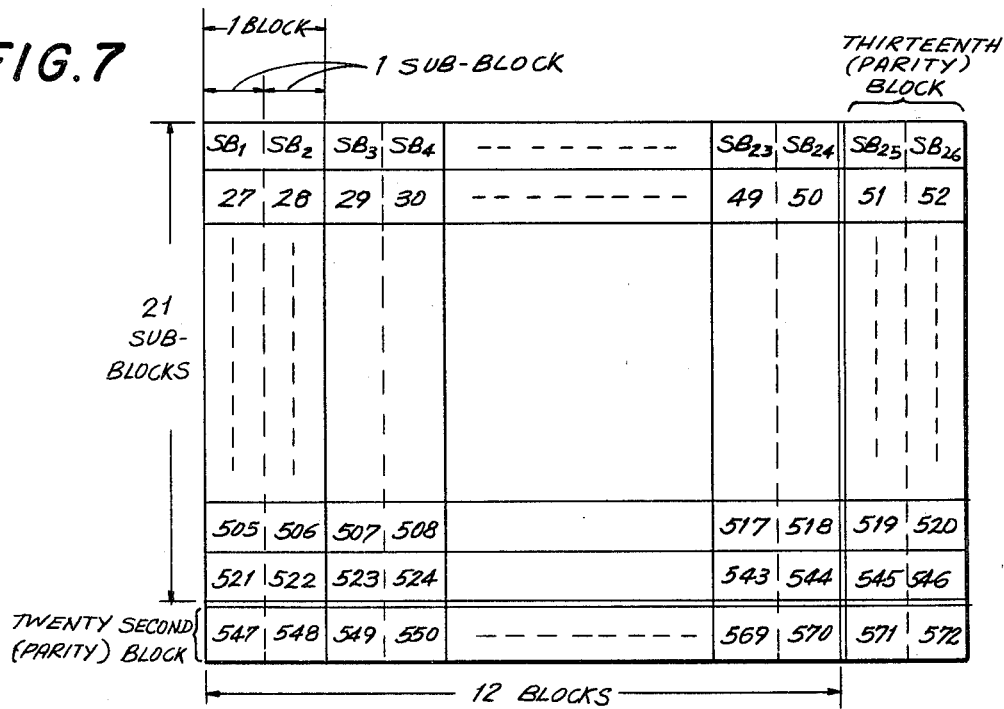

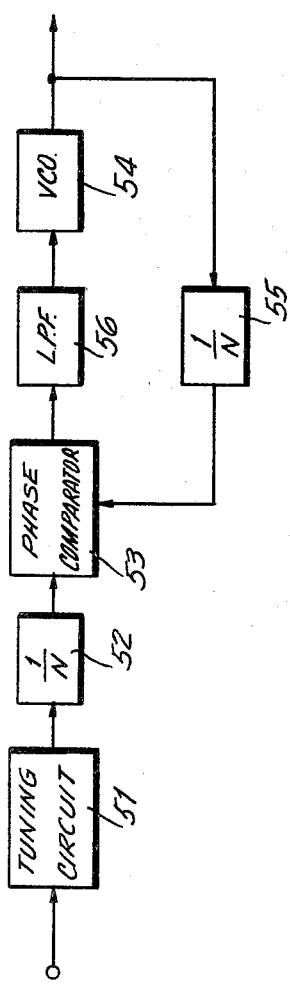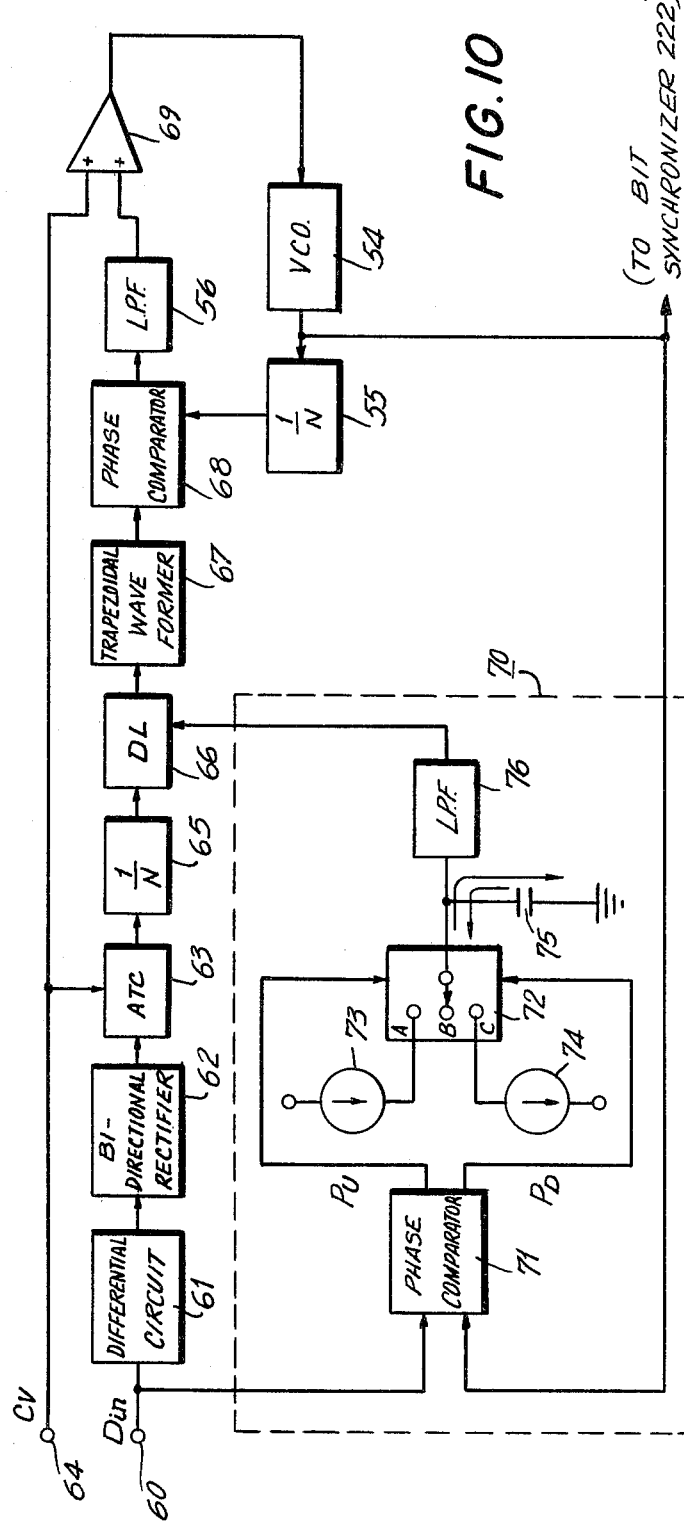

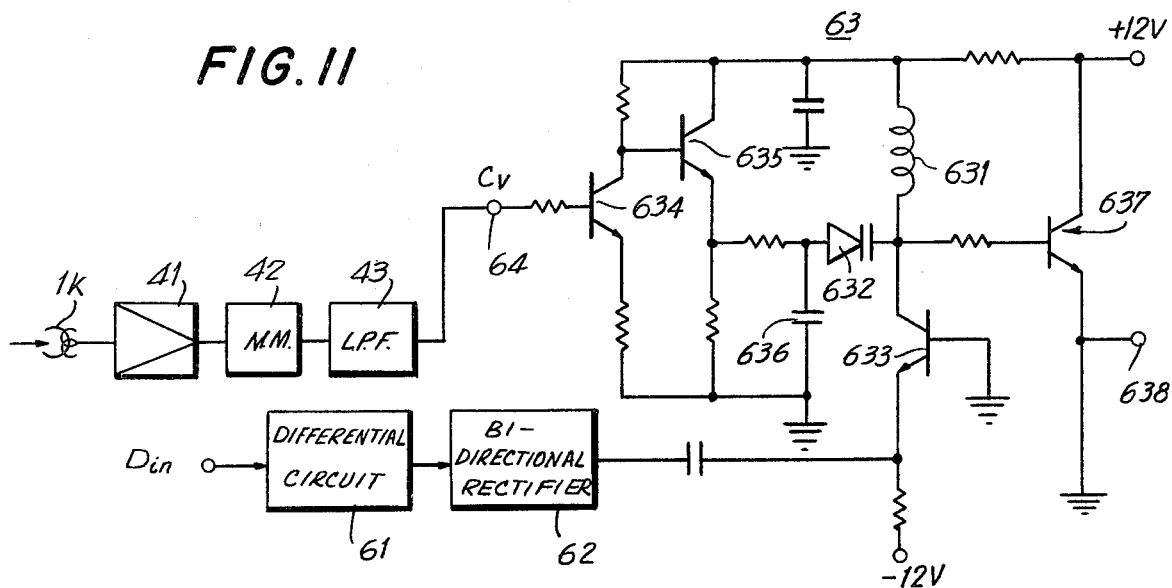
FIG.11
FIG.12A  (D_in)
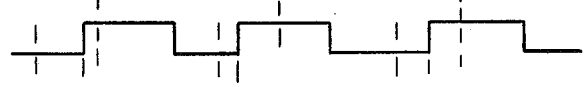
FIG.12B  (O_s)
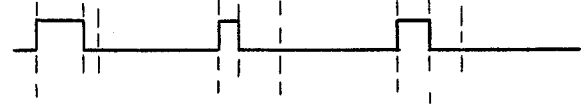
FIG.12C  (P_U)
FIG.12D  (P_D)
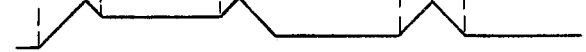
FIG.12E  (E_c)

FIG.13A $(D_{in})$ 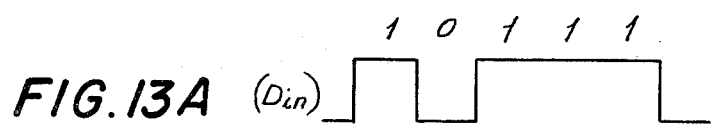
FIG.13B $(O_s)$ 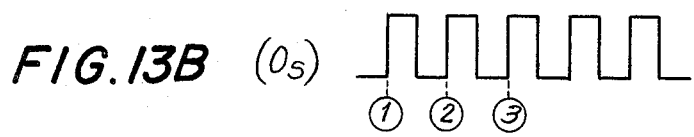
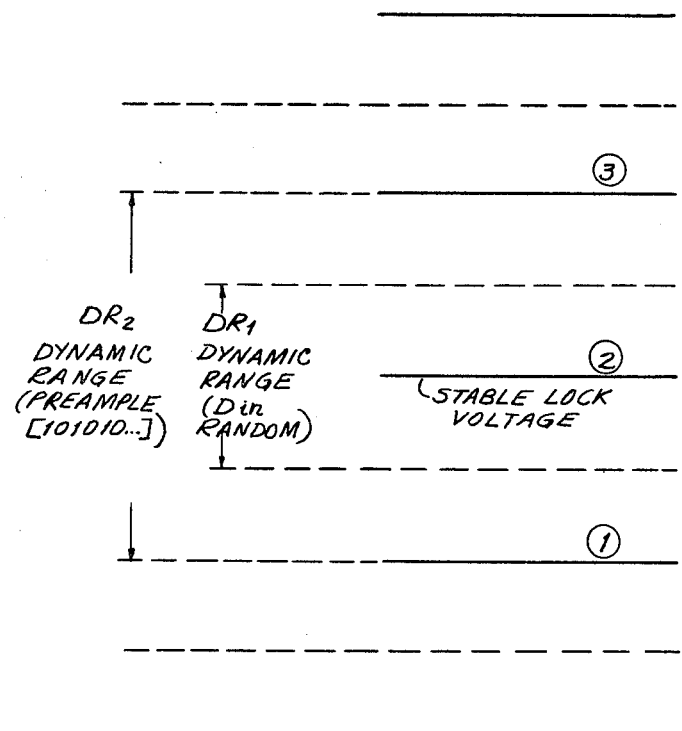
FIG.14

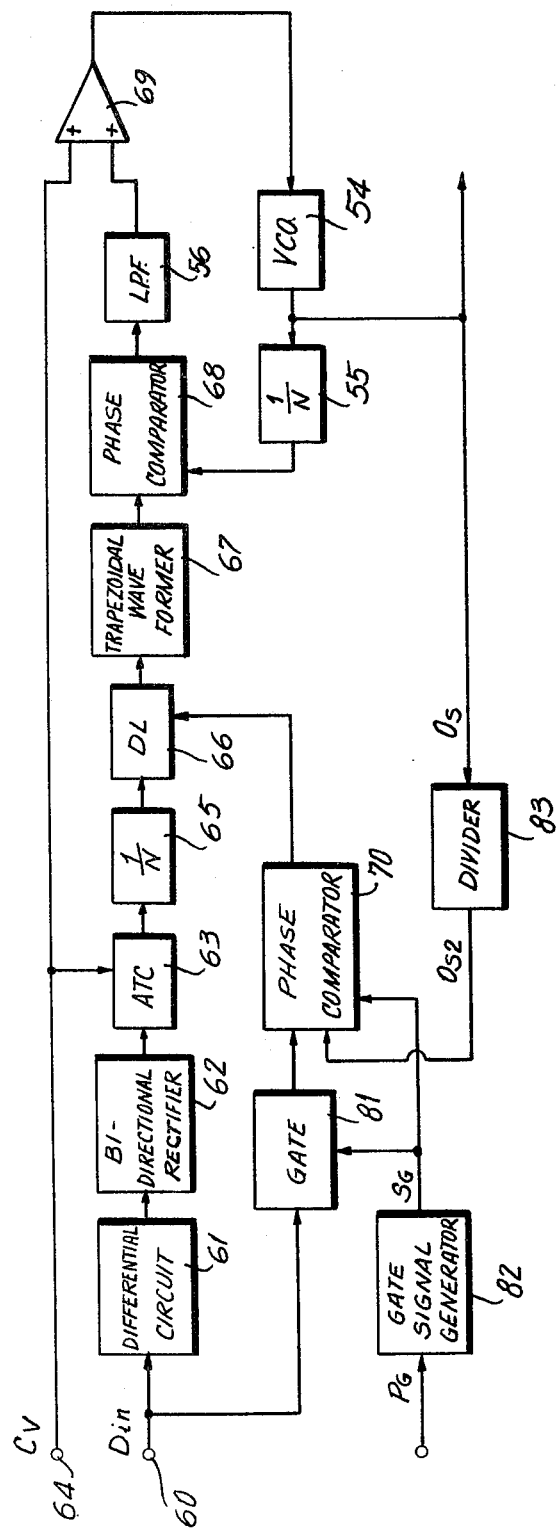

PHASE LOCKED LOOP HAVING AUTOMATIC-INPUT TUNING AND PHASE CONTROL CIRCUITS

BACKGROUND OF THE INVENTION

1. Field of the Invention

This invention relates generally to an automatic phase-controlled oscillator circuit, and more particularly relates to an automatic phase-controlled oscillator circuit suitable for generating a clock pulse to be synchronized with the varying frequency of a played back or received digital signal.

2. Description of the Prior Art

It is known in the art to use a phase-locked loop (PLL) circuit to generate a clock signal which is synchronized with a played back or received digital signal so that the latter can be converted to analog form. In the recording and playing back of a digital signal on magnetic tape by means of a video tape recorder (VTR) or similar apparatus, it has been previously proposed to incorporate a tuning circuit in advance of the input of such a PLL circuit to increase the signal-to-noise ratio (SNR) of the played back or received digital signal, and to assure that the capture range of the PLL circuit is adequate. If such a combination of PLL circuit and tuning circuit is used, then in a normal playback mode in which the tape speed of the VTR is the same as that which was used during recording, reliable synchronization of the PLL circuit with the played back digital signal can be established. However, in a playback mode other than the normal mode, wherein the tape speed is different from that used during recording, for example, in a low-speed playback mode such as a slow or still-picture mode, or in a high-speed playback mode such as a double-speed mode or a so-called search mode operation, the frequency of the reproduced digital signal varies, and, as a result, the output from the tuning circuit is reduced or is shifted in phase. Consequently, such a proposed arrangement has the disadvantage that the PLL circuit does not remain stably locked in phase with the reproduced digital signal.

While this disadvantage could be avoided by omitting the tuning circuit, at least when an other-than-normal playback mode is selected, the SNR of the reproduced signal which is used as a reference signal for the PLL becomes degraded, and the capture range of the PLL circuit is concomitantly narrowed, so that the PLL circuit does not easily lock in with the reproduced digital signal.

OBJECTS AND SUMMARY OF THE INVENTION

It is an object of this invention to provide an automatic phase controlled oscillator circuit which generates a clock signal that is stably locked in phase with a played back or received digital signal.

It is another object of this invention to provide an automatic phase controlled oscillator circuit in which the clock signal is stably locked in phase with a digital signal reproduced from a recording and/or playback device when the latter is in a playback mode other than the normal playback mode.

It is still another object of this invention to provide an automatic phase controlled oscillator circuit which has a wide dynamic range and which can be stably locked in phase notwithstanding temperature drift and input signal fluctuation.

According to an aspect of this invention, an automatic phase-controlled oscillator circuit for producing an output clocking signal whose phase and frequency vary with those of an input information signal applied thereto comprises an input for receiving the input information signal; a variable-frequency tuning circuit for receiving a control signal representing the frequency of the input information signal and coupled to the input circuit for tuning on the basis of the control signal to pass the information signal as a tuned signal; and a clocking signal generator, such as a phase-locked loop circuit, for providing the output clocking signal in dependence upon the phase of the tuned signal. The invention is favorably applied to a digital video tape recorder (DVTR) wherein the information signal is a digital signal reproduced from a tape as a result of relative motion between the tape and the DVTR, and the control signal is provided from the tape to represent such relative motion. The oscillator circuit also preferably includes a phase comparator for providing an error signal representing the phase difference between the input information signal and the output clocking signal, and a phase adjuster, such as a variable delay line, responsive to such error signal.

The above, and other objects, features and advantages of this invention, will be apparent from the following detailed description which is to be read in conjunction with the accompanying drawings.

BRIEF DESCRIPTION OF THE DRAWINGS

FIGS. 1 and 2 are block diagrams illustrating recording and reproducing sections, respectively, of a digital video tape recorder (DVTR) in which a video signal processing apparatus embodying this invention may be advantageously employed;

FIG. 3 is a schematic illustration of a rotary head assembly included in the DVTR of FIGS. 1 and 2;

FIG. 4 is a schematic view of rotary heads included in the assembly of FIG. 3;

FIG. 5 is a schematic plan view of a section of magnetic tape showing tracks in which signals are recorded;

FIGS. 6A, 6B, 6C, and 7 are schematic diagrams to which reference will be made in explaining the digitization and code arrangement of a video signal for use in the digital VTR embodying this invention;

FIG. 8 is a block diagram of the reproducing processor of FIG. 2.

FIG. 9 shows a conventional phase-locked loop circuit.

FIG. 10 is a systematic block diagram of one embodiment of the automatic phase controlled oscillator circuit of this invention.

FIG. 11 is a circuit diagram showing the detail of a portion of the embodiment of FIG. 10.

FIGS. 12A-12E are waveform diagrams for explaining the operation of the embodiment of FIG. 10.

FIGS. 13A and 13B are waveform diagrams for explaining possible limitations of automatic phase controlled oscillator circuits.

FIG. 14 is a chart useful in explaining the dynamic range of a phase comparator.

FIG. 15 is a systematic block diagram illustrating a second embodiment of the automatic phase controlled oscillator circuit of this invention.

FIGS. 16A to 16C are waveform diagrams useful in explaining the operation of the embodiment of FIG. 15.

DESCRIPTION OF THE PREFERRED EMBODIMENTS

The present invention will hereinafter be described as being applied to a DVTR made up of a recording section (FIG. 1) and a playback or reproducing section (FIG. 2). In the DVTR, a digital video signal is recorded by a rotary head assembly (FIG. 3) in parallel tracks extending obliquely on a magnetic tape 2 (FIG. 5). Since the transmitting bit rate of the digital video signal is high, three rotary heads 1A, 1B, and 1C (FIG. 4) are disposed in close proximity to each other, and the digital video signals of one field are distributed through three channels to such heads and are recorded on the magnetic tape in three parallel tracks 3A, 3B, and 3C (FIG. 5). An audio signal may also be converted to a PCM (pulse code modulated) signal and recorded by a rotary head (not shown) in another track (not shown) extending parallel to the video tracks 3A, 3B, and 3C. Alternatively, the audio signal may be recorded in a track 4 (FIG. 5) extending along a longitudinal edge of the tape, in which case it can be in analog form.

Referring in detail to FIG. 1 it will be seen that a color video signal to be recorded is applied through an input terminal 11 to an input processor 12. The input processor 12 may comprise a clamp circuit and a synchronizing and burst signal separator and supplies the effective or video information portion of the color video signal to an A/D converter circuit 13. A synchronizing signal and a burst signal separated from the color video signal by processor 12 are applied to a master clock generator 14 which is desirably of PLL (phase-locked loop) construction. The master clock generator 14 generates clock pulses of a suitable sampling frequency fs. The clock pulses from generator 14 and the synchronizing signal are applied to a control signal generator 15 which produces various timing pulses, identification signals (ID) for identifying lines, fields, frames and tracks, and a control signal, for example, a train of sampling pulses.

The A/D converter circuit 13 generally comprises a sample hold circuit and an A/D converter for converting each sampled output to an 8-bit code which is supplied, in parallel form, to an interface 16. The digitized effective video region of the color video signal is divided by the interface 16 into three channels. The data corresponding to the successive samples of each line are assigned cyclically to the three channels in a repeating order, and the data of the three channels are processed in the same manner. An external digital video signal $D_{ex}$, for example, from a video editing apparatus, may also be supplied to interface 16 to be suitably divided into the three channels. The data in one of the channels is derived as a record signal for head 1A after being applied, in sequence, to a time base compression circuit 17A, an error correcting encoder 18A, a recording processor 19A and a recording amplifier 20A. The data in each of the other channels is also processed by the same arrangement, that is, respectively, by a time base compression circuit 17B, 17C, an error control encoder 18B, 18C, a recording processor 19B, 19C, and a recording amplifier 20B, 20C, to provide record signals for heads 1B and 1C.

In the case of the NTSC color video signal, the duration or period of one line (1H) is 63.5 μs and a blanking period therein is 11.1 μs. Accordingly, the effective video region or portion is 52.4 μs. If the sampling frequency employed in A/D converter circuit 13 is 4 $f_{SCN}$, in which $f_{SCN}$, the color subcarrier frequency, equals 455/2 $f_{HN}$ ($f_{HN}$ being the horizontal or line frequency), then the number of samples in each horizontal period H is 910, as indicated on FIG. 6A. Further, the number of samples in the effective video region of each line is 750, that is, 52.4/63.5×910=750, so that 250 samples can be conveniently assigned to each of the channels for each line.

The number of lines forming one field is 262.5, with a vertical synchronizing period and an equalizing pulse period accounting for 10.5H. Since test signals VIT and VIR, inserted in the vertical blanking period, are also regarded as effective video signals, the number of effective video lines in one field period is selected to be 252.

The code arrangement of each of the record signals respectively provided to the heads 1A, 1B, and 1C will now be described with reference to FIGS. 6B and 6C. As there shown, the data of one line or horizontal period of the color video signal which comprises 250 samples per channel, as previously mentioned, are divided into two, that is, there are two sub-blocks for each line with 125 samples of data for each sub-block. Each sub-block of the coded digital signal may be composed of 134 samples (1072 bits) in which a block synchronizing signal (SYNC) of three samples (24 bits), an identifying (ID) and address (AD) signal of two samples (16 bits), the information data of 125 samples (1000 bits) and CRC (Cyclic Redundancy Check) code of four samples (32 bits) are arranged one after another. The block synchronizing signal is used for identifying the beginning of a sub-block, whereupon the identifying and address signals, the information data and/or CRC code can be extracted. The identifying signals ID indicate the channel (track), the frame, the field, and the line to which the information data of the sub-block belongs, and the address signal AD represents the address of the respective sub-block. The CRC code is used for the detection of an error in the information data of the respective sub-block.

FIG. 7 shows the code arrangement for one field in one channel. In FIG. 7, each reference character SBi (i=1 to 572) indicates one sub-block, with two sub-blocks in each channel (six sub-blocks in total) making up one block or line. Since the effective video region of one field is comprised of 252 lines, as mentioned previously, the data of 252 blocks (504 sub-blocks) exist in one field. The video information data of a particular field are sequentially arranged in a 21×12 matrix form. Parity data are also provided in connection with the horizontal and vertical directions, respectively, of the video information data in the matrix. More particularly, on FIG. 7, the parity data for the horizontal direction are shown positioned in the thirteenth column of blocks, and the parity data for the vertical direction is positioned in the twenty-second row at the bottom. In the thirteenth column of blocks at the twenty-second row is disposed the horizontal parity data for the vertical parity data. The parity data for the horizontal direction is formed in two ways by 12 sub-blocks respectively taken out of the 12 blocks forming one row of the matrix. In the first row, for example, parity data $SB_{25}$ is formed by the modulo-2 addition:

$$[SB_1] \oplus [SB_3] \oplus [SB_5] \oplus \ldots \oplus [SB_{23}] = [SB_{25}]$$

In the above modulo-2 operation, [SBi] indicates the data in the respective sub-block SBi. In this case, samples belonging to respective ones of the 12 sub-blocks are each calculated in a parallel, 8-bit form. Similarly, by the modulo-2 addition:

$$[SB_2] \oplus [SB_4] \oplus [SB_6] \oplus \ldots \oplus [SB_{24}] = [SB_{26}]$$

parity data $[SB_{26}]$ are formed. The parity data are similarly formed for each of the second to twenty-second rows in the horizontal direction. Enhancement of the error correcting ability results from the fact that parity data are not formed merely by the data of the 24 sub-blocks included in a row, but are formed by the data of 12 sub-blocks positioned at intervals in the row.

The parity data for the vertical direction are formed by the data of 21 sub-blocks in each of the first to twelve columns of blocks. In the first column, parity data $[SB_{547}]$ are formed by the modulo-2 addition:

$$[SB_1] \oplus [SB_{27}] \oplus [SB_{53}] \oplus \ldots [SB_{521}] = [SB_{547}].$$

In this case, samples belonging to each one of the 21 sub-blocks are each calculated in a parallel 8-bit form.

Accordingly, these parity data comprise 125 samples as is also the case with the video data of each sub-block. In the case of transmitting the digital signal of one field of the above matrix arrangement (22×13) as a series of first, second, third, ... twenty-second rows in sequence, since 13 blocks correspond to the length of 12H, a period of 12×22=264H is needed for transmitting the digital signal of one field.

Incidentally, if the DVTR is of the C-format type, and thus employs an auxiliary head for recording and reproducing one part of the vertical blanking period in one field, then a duration of only about 250H can be recorded with a video head. Therefore, the period of 264H of data to be transmitted is time-base-compressed (with a compression ratio or Rt of 41/44) to a period or duration of 246H by means of the time base compressor 17A, 17B, or 17C so as to leave a margin of several H's to be recorded in each track. In addition to compressing the video data with the above-noted compression ratio 41/44, each of the time base compressors 17A, 17B, and 17C provides a data blanking period in which the block synchronizing signal, the identifying and address signals and the CRC code are inserted for each sub-block of video data of 125 samples, and at the same time, sets up data blanking periods in which the blocks of the parity data are inserted. The parity data for the horizontal and vertical directions and the CRC code of each sub-block are generated by the respective error correcting encoder 18A, 18B, or 18C. The block synchronizing signal and the identifying and address signals are added to the video data in the respective recording processor 19A, 19B, or 19C. The address signal AD represents the previously noted number (i) of the sub-block. Further, in the recording processor 19A, 19B, or 19C there may be provided an encoder of the block coding type which converts the number of bits of one sample from 8 to 10, and a parallel-to-serial converter for serializing the parallel 10-bit code. As disclosed in detail in U.S. patent application Ser. No. 171,481, dated July 23, 1980, and having a common assignee herewith, the block coding is preferably such that $2^8$ codes where DC levels are close to zero are selected from $2^{10}$ codes of 10-bit length and arranged to have one-to-one correspondence to the original 8-bit codes. By means of the foregoing, the DC level of the record signal is made as close to zero as possible, that is, "0" and "1" alternate with each other as much as possible. Such block coding is employed for preventing degradation of the transmitting waveform on the playback side by achieving substantially DC-free transmission. The same results are also possible by employing a scramble system utilizing the so-called M-sequence, which is substantially random, in place of the block coding.

In the reproducing or playback section of the DVTR to which this invention is advantageously applied, three channels of reproduced signals are derived from the heads 1A, 1B, and 1C which scan tracks 3A, 3B, and 3C, respectively, corresponding thereto. As shown on FIG. 2, the reproduced signals are applied from heads 1A, 1B, and 1C through playback amplifiers 21A, 21B, and 21C to respective playback processors 22A, 22B, and 22C. In each of the playback processors 22A, 22B, and 22C, the serial data are converted to parallel form, the block synchronizing signal is extracted, the data are separated from the block synchronizing signal and from the ID, AD, and CRC codes or signals, and further, block decoding or 10-bit to 8-bit conversion is performed. The resulting data are applied to a respective time base corrector 23A, 23B, or 23C in which any time base error is removed from the data. Each of the time base correctors is provided, for example, with four memories, in which reproduced data are sequentially written by clock pulses synchronized with the reproduced data, and the data are sequentially read out from the memories by reference clock pulses. When the reading operation is likely to get ahead of the writing operation, the memory from which the data has just been read is read again.

The data of each channel are provided from the respective time base corrector 23A, 23B, or 23C to an error correcting decoder 24A, 24B, or 24C in which an error occurring in the information data, and particularly one that cannot be corrected by means of the horizontal and vertical parities, is concealed. The data from each error correcting decoder 24A, 24B, or 24C is applied to a respective time base expander circuit 25A, 25B, or 25C, respectively, which returns the data to the original transmitting rate and then applies the data to a common interface 26. The interface 26 serves to return the reproduced data of the three channels into a single channel which includes a D/A converter circuit 27 for conversion of the data into analog form. From the interface 26 there may also be provided a digital video output $D_{out}$. Since the external digital video input $D_{ex}$ and the corresponding digital video output $D_{out}$ are provided in the recording and reproducing sections of FIGS. 1 and 2, editing and dubbing can be carried out with digital signals, that is, without having to convert the video signal back and forth between digital and analog forms.

The output from D/A converter circuit 27 is applied to an output processor 28, from which a reproduced color video signal is provided at an output terminal 29. An external reference signal is supplied from a terminal 30 to a master clock generator 31, from which clock pulses and a reference synchronizing signal are provided to a control signal generator 32. The control signal generator 32 provides control signals synchronized with the external reference signal, including for example, various timing pulses, identifying signals for the line, field, and frame, and sample clock pulses. In the reproducing section, the processing of the signal from heads 1A, 1B, and 1C to the input sides of time base correctors 23A, 23B, and 23C is timed by a clock pulse extracted from the reproduced data, whereas the processing of the signals from the output sides of the time base correctors 23A, 23B, and 23C to the output terminal 29 is timed by the clock pulse from the master clock generator 31.

As shown in FIG. 8, each of the reproducing processors 22A, 22B, and 22C is constituted by a phase-locked loop (PLL) circuit 221, a bit synchronizer 222, a block signal extractor 223, and a demodulator 224. The digital signal from the respective reproducing amplifier 21A, 21B, or 21C is applied to PLL circuit 221 which generates a clock signal synchronized with the incoming digital signal. This clock signal is then applied to extractor 223 and to bit synchronizer 222 to synchronize the incoming digital signal therewith. The digital signal so synchronized is then applied to extractor 223 to extract the block synchronizing signal SYNC, which is hence provided to demodulator 224 wherein the incoming digital signal is converted from serial to parallel form and at the same time is converted from the 10-bit code to the original 8-bit signal.

As shown in FIG. 9, a conventional version of PLL circuit 221 is formed of a tuning circuit 51 to optimize the signal-to-noise ratio (SNR) and to achieve the maximum capture range of the PLL, a 1/N divider 52 for dividing down the output of tuning circuit 51 and applying the divided down output therefrom to an input of a phase comparator 53. A voltage controlled oscillator (VCO) 54 including a voltage-controlled reactance, such as a variable capacitance diode or varicap, provides an output clocking signal through a 1/N divider 55 to another input of phase comparator 53. The latter provides an error signal, whose level depends on the phase difference between the signal supplied from dividers 52 and 55, through a low pass filter 56 to VCO 54 to control the frequency of the clocking signal.

The PLL circuit described above with reference to FIG. 9 is easily synchronized with the played back digital signal so long as a normal playback mode is selected so that the tape speed is the same as that used during recording. However, if a playback mode other than the normal mode is selected so that the tape speed is different from that used during recording, the frequency of the played back digital signal that is applied to tuning circuit 51 will vary from the center frequency of tuning circuit 51 and the tuned output of the latter will be attenuated or shifted in phase. Thus, if an other-than-normal playback mode is selected, such as a slow mode, a still-picture mode, a double-speed playback mode, or a search mode, the clocking signal supplied from PLL circuit 221 will not be reliably locked in phase with the played back digital signal.

A first embodiment of the present invention, which is described herein with reference to FIGS. 10, 11, and 12A–12E, presents a solution to the problem of locking the phase of the clocking signal to that of the played back digital signal even when an other-than-normal playback mode is selected.

As shown in FIG. 10, in this embodiment of the automatic phase controlled oscillator circuit of this invention, a digital input signal $D_{in}$ is applied to a data input terminal 60 and thence through a differential circuit 61 and a bi-directional rectifier 62 to an input of an automatic tuning circuit 63. A control signal voltage $C_V$ is applied to a control voltage input terminal 64 and thence to a control input of automatic tuning circuit 63. The latter provides a tuned signal through a 1/N divider 65 to a variable delay line 66 formed, for example, from a monostable multivibrator, and the delayed output therefrom is in turn supplied to a trapezoidal wave generator 67 which produces a trapezoidal waveform signal and supplies the same to a phase comparator 68. VCO 54, 1/N divider 55, and low pass filter 56, which are substantially identical with the like-numbered elements of the circuit of FIG. 9, together with comparator 68, form the phase-locked loop circuit. In addition, an adder circuit 69 is included between low pass filter 56 and VCO 54. Low pass filter 56 is coupled to one input of adder circuit 69, while control signal voltage input terminal 64 is coupled to another input thereof. The arrangement including adder circuit 69 enables the frequency of VCO 54 to be rapidly shifted by means of the control signal voltage $C_V$ whenever the tape speed is changed discontinuously, for example, if the selected playback mode is changed.

With the arrangement as described above, PLL circuit 54, 55, 68, 56, 69 will reliably provide a clocking signal having a constant phase difference relative to the input digital signal even if the frequency of input digital signal $D_{in}$ changes as a result of the selection of a mode other than the normal playback mode.

The automatic tuning circuit 63 of this embodiment of the invention is shown in greater detail in FIG. 11, wherein control pulses CTL from a control track 5 (FIG. 5) are picked up by a control head 1K. Control pulses CTL are applied therefrom through an amplifier 41 to a monostable multivibrator 42 which provides as an output thereof a pulse signal whose duty cycle is substantially proportional to the frequency of control pulses CTL. The output of multivibrator 42 is supplied through a low pass filter 43 to control signal input terminal 64 as a control signal voltage $C_V$ which varies in level with the frequency of control signals CTL. A coil 631 and an electrically variable capacitor 632, here a variable capacitance diode or varicap, together form a tank circuit having a resonant frequency which varies according to the voltage applied to electrically variable capacitor 632. Digital input signal $D_{in}$ is applied through differential circuit 61 and bi-directional rectifier 62 to the emitter of a common-base transistor 633 whose base is grounded and whose collector is coupled to the junction of coil 631 and electrically variable capacitor 632. An amplifier transistor 634 whose base is connected to control signal input 64 inverts and amplifies control signal voltage $C_V$, and has its collector coupled to the base of an emitter-follower transistor 635 whose emitter is coupled to a capacitor 636 to control the DC voltage applied to electrically variable capacitor 632, so that such voltage is reversely proportional to control signal voltage $C_V$. As a result, tank circuit 631, 632, and transistor 633 form a variable band pass filter whose center frequency is controlled by the voltage stored on capacitor 636. Emitter-follower transistor 637, which is an isolation stage, then provides at an output 638 thereof a tuned output signal.

Because control signal voltage $C_V$ is proportional to tape speed, when tape speed becomes higher than that used during recording and hence higher than that used during a normal playback mode, and the frequency of the played-back data input signal $D_{in}$ is raised, voltage $C_V$ is also raised. In that event, transistor 635 acts to lower the voltage stored on capacitor 636, and raise the voltage across electrically variable capacitor 632, thus reducing its capacitance and raising the tuning frequency of tank circuit 631, 632 to the frequency of the reproduced digital input signal $D_{in}$. In this way, the tuning frequency of automatic tuning circuit 63 changes with tape speed. Here, the value of capacitor 636 is selected to be sufficiently larger than the capacitance of variable capacitor 632 so that capacitor 636 does not play any significant part in determining the resonant frequency of the tank circuit 631, 632.

As further shown in FIG. 10, a charge-pump phase comparator circuit 70 is used to control the amount of delay imparted by delay line 66 to compensate for any shift in phase imparted by automatic tuning circuit 63 due to change in frequency of the digital input signal $D_{in}$. In the change-pump phase-comparison circuit 70, a phase comparator 71 has inputs respectively coupled to compare the phase of digital input signal $D_{in}$ (FIG. 12A) with the output signal $O_S$ of VCO 54 (FIG. 12B). Comparator 71 then provides a first output $P_U$ (FIG. 12C) which is "1" from the leading edge of digital input signal $D_{in}$ until the trailing edge of VCO output signal $O_S$, and "0" otherwise; and a second output $P_D$ (FIG. 12D) which is "1" from the leading edge of signal $O_S$ until the trailing edge of signal $D_{in}$, and "0" otherwise. A switching circuit 72 has a first terminal A coupled to a positive current source 73, a second, neutral terminal B and a third terminal C coupled to a negative current source 74. Outputs $P_U$ and $P_D$ are applied from comparator 71 to switch 72 so that it switches over to current source 73 when output $P_U$ is "1", switches over to source 74 when output $P_D$ is "1" and remains at neutral terminal B otherwise. Thus, the occurrence of outputs $P_U$ and $P_D$ cause positive and negative currents, respectively, to flow to a holding capacitor 75, so that a voltage $E_C$ (FIG. 12E) is stored thereon. This stored voltage $E_C$ is then applied through a low pass filter 76 to a control terminal of delay line 66.

Thus, as described above, voltage $E_C$ stored in capacitor 75 is an error signal output of the charge-pump type phase-comparator circuit 70, and will be proportional to any phase shift caused by automatic tuning circuit 63.

If, as mentioned above, delay circuit 66 includes a monostable multivibrator having a time-constant circuit formed, at least in part, by a variable-capacitance diode, voltage $E_C$ can be applied to change the capacitance of such variable-capacitance diode, so that the time-constant of the monostable multivibrator will vary in accordance with voltage $E_C$. In other words, if the phase of the variable frequency oscillator 54 is in advance of the input digital signal $D_{in}$, the amount of delay imparted by delay line 66 can be selected to be small and if any variance in phase occurs in the automatic tuning circuit 63, the output from VCO 54 is controlled by lengthening the delay time of delay line 66 so that the phase difference between output signal $O_S$ of VCO 54 and input digital signal $D_{in}$ may be held constant.

In the circuit as shown in FIG. 10, the frequency and phase of the output signal $O_S$ of VCO 54 are locked with the frequency and phase of a reference signal by a first loop including divider 55, phase comparator 68, filter 56, and adder circuit 69, while a second loop, including phase comparator circuit 70 controls the phase of such reference signal.

The dynamic range and capture range of the arrangement of FIG. 10 will be considered with reference to FIGS. 13A, 13B, and 14. The output $O_S$ of VCO 54 is signal having a period equal to one bit interval of input signal $D_{in}$ as shown in FIGS. 13A and 13B. In the event that input digital signal $D_{in}$ is [10111 ...] and occurs as a rectangular wave signal as shown in FIG. 13A, and output signal $O_S$ from VCO 54 bears a phase relationship thereto as shown in FIG. 13B, assuming that the output voltage from phase comparator circuit 70 can vary without limit, then the phase-locked loop circuit can be locked at any of the rising edges of output signal $O_S$, such as indicated by ①, ②, ③ of FIG. 13B. That is, even if the rising edges of output signal $O_S$ initially have the phase ①, ②, or ③ relative to the rising edges of digital input signal $D_{in}$, VCO 54 can be locked in phase merely by obtaining from phase comparator circuit 70 an error voltage that corresponds to a phase shift of one period of output signal $O_S$. In other words, a plurality of stable points are provided for locking the phase of VCO 54. Consequently, the range over which the error voltage from phase comparator circuit 70 is variable, that is, the dynamic range of the loop including phase comparator circuit 70, is selected so that its width corresponds to the voltage representing a phase shaft of one period of output signal $O_S$. Such voltage then represents the center of the range and can be taken as one of the stable points. Thus, in the event that the error voltage from phase comparator circuit 70 is shifted outside the dynamic range, the PLL circuit will tend to become locked at another stable point corresponding to an error voltage which is higher or lower than the stable point within the dynamic range by an amount representing one period. However, because such stable points are outside the dynamic range, the PLL circuit will not lock at such other stable points.

In the embodiment as shown in FIG. 10, because the loop including phase comparator circuit 70 is used to adjust the phase relationship between digital input signal $D_{in}$ and the output signal $O_S$ from VCO 54, it is desirable to use a version therefor of digital input signal $D_{in}$ before it is adjusted by automatic tuning circuit 63, and therefore, output signal $O_S$ applied from VCO 54 to phase comparator 71 is not frequency-divided. As a result, the dynamic range of the error voltage from phase comparator circuit 70 is rather narrow, such as is indicated by range $DR_1$ in FIG. 14. There, dynamic range $DR_1$ has a width corresponding to a phase shift of only a single period of output signal $O_S$.

In order to expand the dynamic range of the error signal provided from phase comparator circuit 70, and thereby to enlarge the dynamic range of the loop including comparator 70, a portion of digital input signal $D_{in}$ of a predetermined period, in which the digital input signal follows a predetermined periodic pattern, is extracted from digital input signal $D_{in}$ and the phase comparison is performed by circuit 70 only on the basis of the digital input signal $D_{in}$ only during this period. Because the reference signal used for comparison by phase comparator 70 is periodic, phase comparator circuit 70 can operate with a frequency-divided version of output signal $O_S$.

For the sake of example, if a divided-down signal $O_{S2}$ obtained by frequency dividing output signal $O_S$ by two is used as a comparison signal in phase comparator 70, since a single period of the signal $O_{S2}$ is twice that of signal $O_S$, the dynamic range $DR_2$ (FIG. 14) of the error voltage from phase comparator 70 is twice the dynamic range $DR_1$ of the embodiment of FIG. 10. Preferably, the periodic digital signal is inserted at a predetermined time during recording such as at the beginning of a field period.

A second embodiment of this invention, which achieves the extended dynamic range $DR_2$ is illustrated in FIG. 15, in which elements in common with the embodiment of FIG. 10 are identified by like reference numerals and a detailed description thereof is omitted. In the embodiment of FIG. 15, a gate circuit 81 is disposed between digital input terminal 60 and phase comparator 70, and a gate signal generator 82 provides a gating signal to gate circuit 81 and also to phase comparator 70. A ½ divider 83 is disposed between VCO 54 and phase comparator 70 to provide a divided-down signal $O_{S2}$ to the latter to be compared with the output of gate circuit 81. A reference pulse PG (FIG. 16A), which can be generated in response to rotation of a head drum on which heads 1A, 1B, 1C are mounted and which indicates the time that the rotary head 1A, 1B, or 1C comes into contact with the tape, is applied to gate signal generating circuit 82, and in response thereto the latter provides a gate signal SG (FIG. 16B) which is at a high level for a predetermined period of time. As shown in FIG. 16C, the digital input signal $D_{in}$ includes a preamble at the beginning of each field interval, followed by an interval of video information data, which in turn is followed by a postamble. Here, the timing of gate signal SG corresponds to the occurrence of the preamble of digital signal $D_{in}$ and the preamble of digital input signal $D_{in}$ is provided to phase comparator 70 only during the occurrence of gate signal SG. This gated preamble is then compared with the frequency-divided version $O_{S2}$ of output signal $O_S$ VCO 54. Also, as gate signal SG is applied to phase comparator circuit 70, comparison of the digital input signal $D_{in}$ with signal $O_{S2}$ occurs only during the occurrence of the preamble. In the period during which gate signal SG is at a low level, switching circuit 72 (better shown in FIG. 10) is held at neutral terminal B, and the voltage held in capacitor 75 remains constant.

Because in a DVTR the head drum is locked in phase even during an other-than-normal playback mode, notwithstanding that the tape speed may be different from that employed during recording, the timing relationship shown on FIGS. 16A–16C is maintained, and the preamble signal can be extracted from digital input signal $D_{in}$ with high accuracy. In this embodiment, because the digital input signal $D_{in}$ is precisely periodic during the preamble, and such periodic signal can be extracted and used as the reference signal for comparison with signal $O_{S2}$, it is possible to frequency-divide the oscillation output from VCO 54 for comparison in phase comparator 70, thereby enabling the dynamic range of phase comparator circuit 70 to be enlarged. Accordingly, a PLL circuit can be realized which stably locks the phase of output signal $O_{S2}$ to that of a digital input signal $D_{in}$ regardless of any temperature drift or change in the characteristic of VCO 54.

In the embodiment of FIG. 15, the preamble preferably occurs in the form of alternating ones and zeros, to wit, [10101010], and the output signal $O_S$ of VCO 54 is frequency-divided by two, so that the dynamic range of phase comparator 70 is increased two-fold, to the range $DR_2$ of FIG. 14. However, if, alternatively the preamble signal occurs in the form [11001100] and the output signal $O_S$ provided from a VCO 54 were divided by four, the dynamic range would be enlarged four times.

In the above embodiment, for the sake of simplicity, only the preamble signal is used as a periodic signal for controlling the phase of signal $O_S$. However, the postamble, which also occurs in each field following the interval of video information data, can also be employed, either alone or in conjunction with the preamble as a reference signal for comparison in comparator 70.

Moreover, according to the present invention, it is possible to employ delay circuit 66 between divider 55 and phase comparator 68 rather than at the illustrated location between divider 65 and trapezoidal waveform generating circuit 67, and to control the delay of delay circuit 66 in response to the error voltage from phase comparator circuit 70, thereby controlling the sampling point of the trapezoidal signal provided from circuit 67.

In addition, phase comparator circuit 70 has been herein illustrated as being of the charge-pump type, but the construction thereof is not limited to that type, for the same can easily be formed, for example, as a complete-integrating type having an integrator stage following a comparator stage, or as a trapezoidal waveform sampling type.

Furthermore, delay circuit 66 need not be the type which employs a monostable multivibrator having a variable capacitance diode in its time constant circuit. It is also possible, for example, to suitably construct delay circuit 66 as an N-step counter, in which a present value thereof is digitally changed by the error signal from circuit 70.

It should be noted that although embodiments of the present invention have been shown in a form suitable for use in the reproducing section of a DVTR, the present invention is, of course, not limited to use specifically in that environment.

It is apparent that many further modifications and variations can be effected by one skilled in the art without departing from the spirit or scope of the present invention, which is to be ascertained by the appended claims.

What is claimed is:

1. An automatic phase-controlled oscillator for producing an output clocking signal whose phase and frequency vary with those of an input information signal applied thereto, comprising:
information signal input means for receiving said information signal;
control signal means for deriving a control signal representative of the frequency of said input information signal, but deriving said control signal independently from said information signal;
variable-frequency tuning circuit means for receiving said control signal and coupled to said input means for tuning on the basis of said control signal to pass said input information signal as a tuned signal; and
clocking signal generating circuit means for providing said output clocking signal in dependence upon the phase of said tuned signal.

2. An automatic phase-controlled oscillator circuit for producing an output clocking signal whose phase and frequency vary with those of an input information signal in the form of a signal reproduced from a tape by a tape reproducing device as a result of relative motion between said tape and said reproducing device, and wherein a control signal reproduced independently of said reproduced signal but representative of the frequency of said reproduced signal is generated to represent said relative motion; comprising:
input means for receiving said information signal;
variable-frequency tuning circuit means for receiving said control signal and coupled to said input means for tuning on the basis of said control signal to pass said information signal as a tuned signal; and
clocking signal generating circuit means for providing said output clocking signal in dependence upon the phase of said tuned signal.

3. An automatic phase-controlled oscillator circuit according to claim 2, wherein said information signal is a digitized video signal reproduced by a rotary reproducing transducer traversing the tape at an angle to the direction of transport motion of the tape, and said control signal is reproduced from a track which is recorded along the direction of transport motion of the tape.

4. An automatic phase-controlled oscillator circuit according to claim 1, wherein said clocking signal generating circuit means includes a phase-locked loop circuit formed of voltage controlled oscillator means generating said output clocking signal at a frequency in dependence on an error voltage applied thereto; means for providing a phase-comparison signal with a fixed phase relationship to said output clocking signal to be compared with said tuned signal; and phase comparator means supplied with said tuned signal and with said phase-comparison signal for providing said error voltage to said voltage controlled oscillator means, wherein the level of said error voltage depends on the relative phase of said tuned signal and said signal to be compared therewith.

5. An automatic phase-controlled oscillator circuit according to claim 4, wherein said phase-locked loop circuit further includes adder means for providing a sum signal, formed of said error voltage and a voltage corresponding to said control signal, as said error voltage to said voltage controlled oscillator means, thereby extending the capture range of said phase-locked loop circuit.

6. An automatic phase-controlled oscillator circuit according to claim 1, further comprising:
phase comparator means for providing a phase-error signal representing the relative phases of said input information signal and said output clocking signal; and
phase adjusting means between said variable frequency tuning circuit means and said clocking signal generating circuit means for adjusting the phase of said tuned signal on the basis of said phase-error signal.

7. An automatic phase-controlled oscillator circuit according to claim 6, wherein said phase adjusting means includes a variable delay line imparting to said tuned signal an amount of delay determined by the value of said phase-error signal.

8. An automatic phase-controlled oscillator circuit according to claim 7, wherein said phase comparator means includes a phase comparator coupled to compare said input information signal and said output clocking signal and to provide a first switching signal and a second switching signal when the phase of said input information signal is in advance of the phase of said output clocking signal and when the former is behind the latter, respectively; first and second current sources providing current in first and second opposite senses, respectively; holding means for holding a voltage as said phase error signal; and switching means for selectively coupling said first and second current sources to said holding means in response to said first and second switching signals, respectively, so that said voltage held in said holding means corresponds to the average phase difference between said input information signal and said output clocking signal.

9. An automatic phase-controlled oscillator circuit according to claim 8, wherein said holding means includes a holding capacitor coupled to said switching means and a smoothing filter coupled between said holding capacitor and said phase adjusting means.

10. An automatic phase-controlled oscillator circuit according to claim 1, wherein said variable frequency tuning circuit means includes variable tank circuit means arranged to receive and pass said information signal and having a tuning input; and means for applying to said tuning input a tuning voltage that varies with said control signal.

11. An automatic phase-controlled oscillator circuit according to claim 10, wherein said variable tank circuit means includes a coil coupled with an electrically variable capacitor.

12. An automatic phase-controlled oscillator circuit according to claim 11, wherein said electrically variable capacitor is a varactor diode coupled at one end to said coil and at the other end to said means for applying said tuning voltage.

13. An automatic phase-controlled oscillator circuit according to claim 10, wherein said means for applying a tuning voltage includes an integrator circuit for providing as said control signal a voltage level that varies with the frequency of control pulses applied thereto.

14. An automatic phase-controlled oscillator circuit for producing an output clocking signal whose phase and frequency vary with those of an input information signal applied thereto and employing a control signal representative of the frequency of said input information signal but derived independently therefrom; comprising:
input means for receiving said information signal;
variable-frequency tuning circuit means for receiving said control signal and coupled to said input means for tuning on the basis of said control signal to pass said input information signal as a tuned signal, including variable tank circuit means arranged to receive and pass said information signal and having a tuning input, and integrator circuit means for providing to said tuning input said control signal as a voltage level that varies in accordance with the frequency of control pulses applied thereto, said integrator circuit being formed as a monostable multivibrator followed by a low pass filter; and
clocking signal generating circuit means for providing said output clocking signal in dependence upon the phase of said tuned signal.

15. An automatic phase-controlled oscillator circuit according to claim 10, wherein said input means includes a differentiator circuit coupled to receive said input information signal and a bidirectional rectifier coupled between said differentiator circuit and said variable tank circuit means.

16. An automatic phase-controlled oscillator circuit according to claim 15, further including a common-base transistor having an emitter coupled to said bidirectional rectifier, a base coupled to a reference potential, and a collector coupled to said variable tank circuit means.

17. An automatic phase-controlled oscillator circuit according to claim 1, further comprising phase correction loop means provided to compensate for phase shifts induced by said tuning circuit means and including phase comparator means having first and second inputs coupled respectively to receive said input information signal and a version of said output clocking signal and providing a phase-error signal in response to the phase difference therebetween, and variable delay means responsive to said phase-error signal for changing the relative phase of said tuned signal and said output clocking signal in the sense to compensate for such phase shifts.

* * * * *